US012630927B2

(12) United States Patent
Kobayashi

(10) Patent No.: US 12,630,927 B2
(45) Date of Patent: May 19, 2026

(54) METHOD OF CONTROLLING ROTARY TABLE AND PROCESSING APPARATUS

(71) Applicant: Tokyo Electron Limited, Tokyo (JP)

(72) Inventor: Takeshi Kobayashi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 775 days.

(21) Appl. No.: 17/678,445

(22) Filed: Feb. 23, 2022

(65) Prior Publication Data

US 2022/0275508 A1 Sep. 1, 2022

(30) Foreign Application Priority Data

Mar. 1, 2021 (JP) .................................. 2021-031565

(51) Int. Cl.
*C23C 16/458* (2006.01)
*C23C 16/52* (2006.01)
*H10P 72/00* (2026.01)
*H10P 72/76* (2026.01)

(52) U.S. Cl.
CPC .......... *C23C 16/4584* (2013.01); *C23C 16/52* (2013.01); *H10P 72/0602* (2026.01); *H10P 72/7612* (2026.01); *H10P 72/7618* (2026.01); *H10P 72/7621* (2026.01)

(58) Field of Classification Search
CPC ................ C23C 16/4584; C23C 16/52; H01L 21/67248; H01L 21/68742; H01L 21/68764; H01L 21/68771
See application file for complete search history.

(56) References Cited

U.S. PATENT DOCUMENTS

| | | | | |
|---|---|---|---|---|
| 2018/0294176 A1* | 10/2018 | Nakagawasai | .... | H01L 21/68792 |
| 2019/0194807 A1* | 6/2019 | Koakutsu | ......... | H01L 21/67276 |
| 2020/0149159 A1* | 5/2020 | Okajima | ........... | H01L 21/67103 |

FOREIGN PATENT DOCUMENTS

| | | |
|---|---|---|
| JP | H03-211822 A | 9/1991 |
| JP | H03-252127 A | 11/1991 |
| JP | 2007-123843 A | 5/2007 |
| JP | 2014-140870 A | 8/2014 |
| JP | 2016-081952 A | 5/2016 |
| JP | 2017014602 A | 1/2017 |
| JP | 2018170307 A | 11/2018 |
| JP | 2019-114604 A | 7/2019 |
| KR | 20110084616 A | 7/2011 |

* cited by examiner

*Primary Examiner* — Michael P Wieczorek
(74) *Attorney, Agent, or Firm* — Venjuris, P.C.

(57) ABSTRACT

A method of controlling a processing apparatus includes providing the processing apparatus including a chamber; a rotary table accommodated within the chamber, including a stage on which a plurality of substrates is to be placed, and rotatable and movable in an up and down direction; a heater provided below the rotary table; and a temperature sensor that measures a temperature of the rotary table. The method further includes acquiring the temperature measured by the temperature sensor; and moving up and down a position of the rotary table according to a result of comparison between the acquired temperature and a target temperature during an idle time during which a specific process is not performed in the chamber.

10 Claims, 6 Drawing Sheets

METHOD OF CONTROLLING ROTARY TABLE AND PROCESSING APPARATUS

CROSS-REFERENCE TO RELATED APPLICATIONS D

This application is based on and claims priority from Japanese Patent Application No. 2021-031565, filed on Mar. 1, 2021 with the Japan Patent Office, the disclosure of which is incorporated herein in its entirety by reference.

TECHNICAL FIELD

The present disclosure relates to a method of controlling a rotary table and a processing apparatus.

BACKGROUND

Japanese Patent Laid-Open Publication No. 2016-081952 discloses a dummy process in which a dummy wafer is placed on a rotary table. The dummy process is executed after the processing of a wafer placed on a stage of the rotary table is ended but the wafer processing for a next lot is not continuously performed. In Japanese Patent Laid-Open Publication No. 2016-081952, the dummy process is repeatedly performed until the wafer processing for the next lot is started, so that temperature conditions, etc. are maintained when the next lot wafer processing is performed.

SUMMARY

According to one aspect of the present disclosure, a method of controlling a processing apparatus includes providing the processing apparatus including a chamber; a rotary table accommodated within the chamber, including a stage on which a plurality of substrates is to be placed, and rotatable and movable in an up and down direction; a heater provided below the rotary table; and a temperature sensor that measures a temperature of the rotary table. The method further includes acquiring the temperature measured by the temperature sensor; and moving up and down a position of the rotary table according to a result of comparison between the acquired temperature and a target temperature during an idle time during which a specific process is not performed in the chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
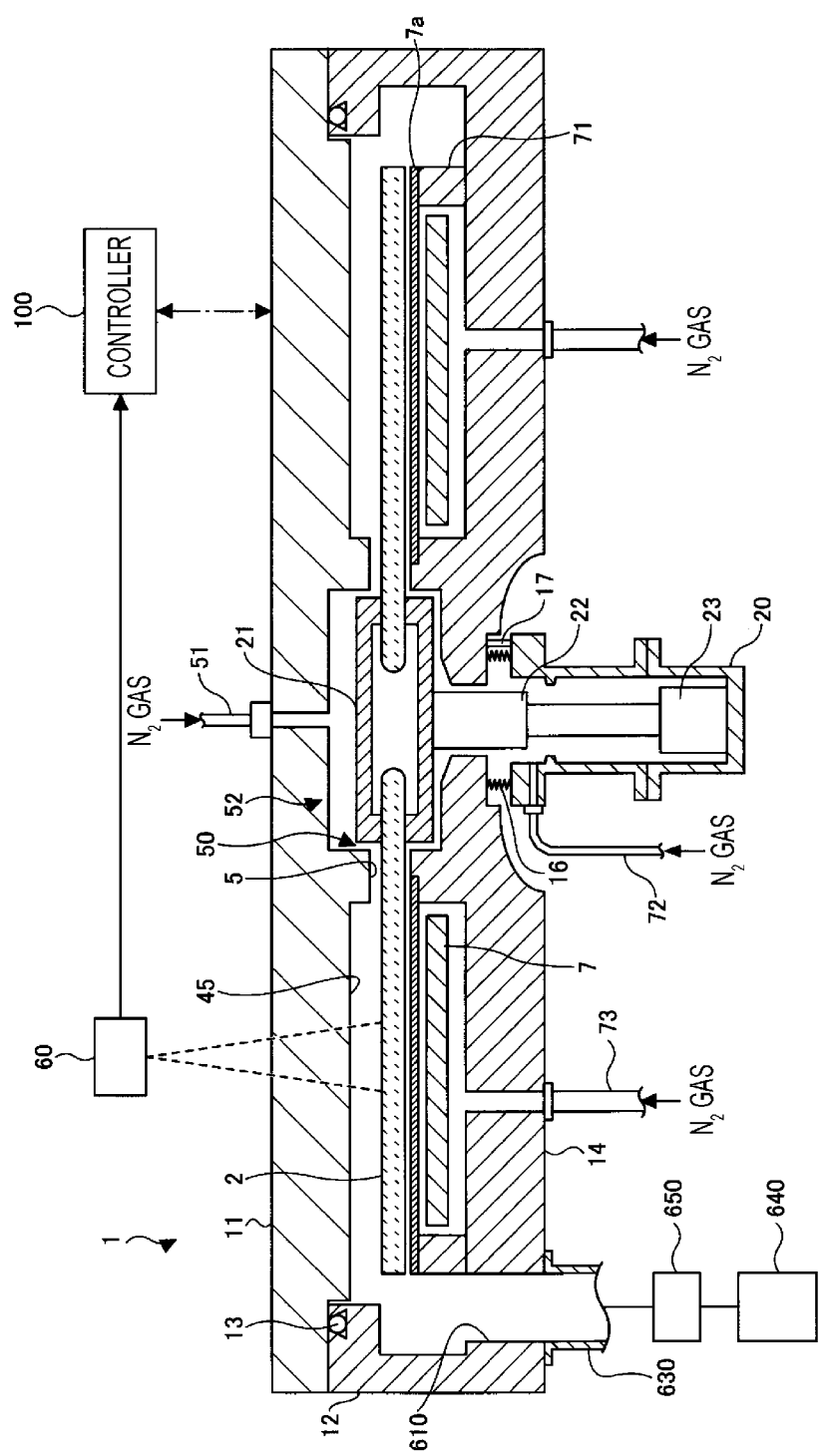
FIG. 1 is a schematic sectional view illustrating an example of a film forming apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, an embodiment of the present disclosure will be described with reference to drawings. In each drawing, the same components may be denoted by the same reference numerals, and duplicate descriptions thereof may be omitted in some cases.

[Film Forming Apparatus]

First, a film forming apparatus according to an embodiment will be described with reference to FIG. 1. The film forming apparatus in FIG. 1 is an example of a processing apparatus of which the rotary table is controlled by the method of the present disclosure.

The film forming apparatus of the present disclosure has a chamber 1 having a substantially circular planer shape, and a rotary table 2 provided within the chamber 1 and having a rotation center at the center of the chamber 1. The chamber 1 has a container body 12 having a bottomed cylindrical shape, and a top plate 11 that is airtightly and detachably disposed on the upper surface of the container body 12 via a sealing member 13 such as, for example, an O-ring.

The rotary table 2 is fixed to a cylindrical core 21 at the central portion thereof, and the core 21 is rotatably provided while being fixed to the upper end of a rotary shaft 22 extending in the vertical direction. The rotary shaft 22 passes through a bottom 14 of the chamber 1, and the lower end thereof is attached to a drive unit 23 that rotates the rotary shaft 22 around the vertical axis. The rotary shaft 22 and the drive unit 23 are accommodated within a tubular case 20 having a top opening. A bellows 16 is provided between the bottom 14 of the container body 12 and the case 20. Accordingly, the case 20 is airtightly attached to the lower surface of the bottom 14 of the chamber 1, so that the internal atmosphere of the case 20 is isolated from the external atmosphere. The drive unit 23 may be a motor.

A lift mechanism 17 is provided outside the bellows 16. The lift mechanism 17 is capable of changing the height of the rotary table 2 by moving up and down the rotary table 2. With such a configuration of the lift mechanism 17, the rotary table 2 is moved up and down, so that a distance between a ceiling surface 45 and a wafer W may be changed as the rotary table 2 is moved up and down. The lift mechanism 17 may be implemented by various configurations as long as the rotary table 2 is movable up and down. For example, the lift mechanism 17 may have a structure which expands/contracts the length of the rotary shaft 22 through, for example, a gear.

A first exhaust port 610 is provided at the outer edge in the chamber 1, and communicates with an exhaust pipe 630. The exhaust pipe 630 is connected to a vacuum pump 640 via a pressure regulator 650. With this configuration, the inside of the chamber 1 may be exhausted from the first exhaust port 610.

Figure 2:
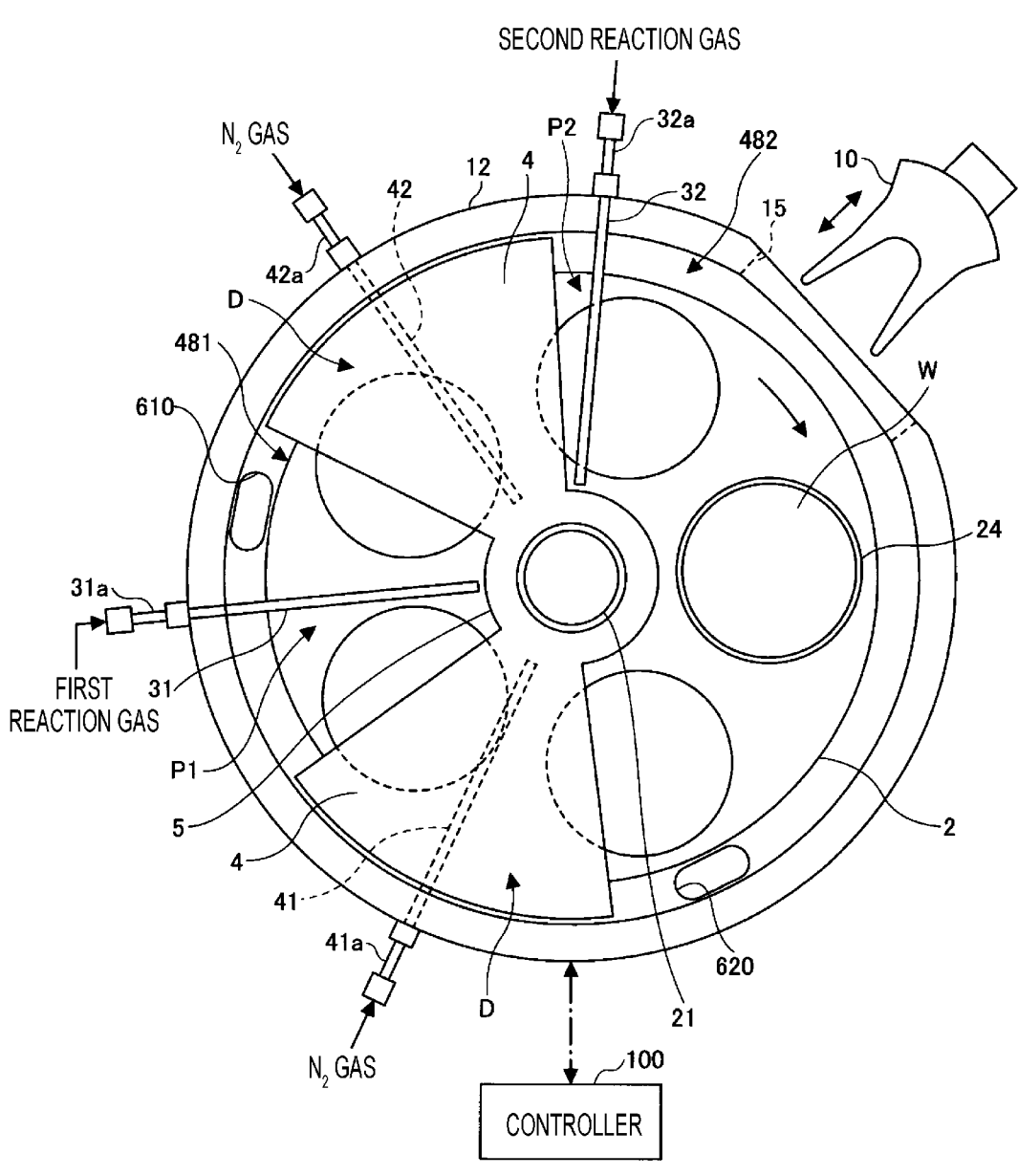
FIG. 2 is a view for explaining a structure within a chamber according to the embodiment.

FIG. 2 is a view for explaining the structure within the chamber 1, and illustrates the structure within the chamber 1 when the film forming apparatus according to the embodiment is viewed from top, in which the top plate 11 is omitted in the illustration. As illustrated in FIG. 2, circular recesses 24 are provided on the surface of the rotary table 2. On the circular recesses 24, a plurality of semiconductor wafers W (five wafers in the illustrated example) (hereinafter, referred to as "substrates" or "wafers") is to be placed along the rotation direction (circumferential direction). FIG. 2 illustrates a wafer W on one recess 24. This recess 24 is a stage having an inner diameter slightly larger (for example, by 2 mm) than the diameter of the wafer W (for example, 300 mm) and a depth substantially equal to the thickness of the wafer W, and configured to place the wafer W thereon. Therefore, when the wafer W is placed on the recess 24, the surface of the wafer W has the same height as the surface of the rotary table 2 (a region where no wafer W is placed). Through holes (none of which are illustrated) are formed in the bottom surface of the recess 24. For example, three lift pins pass through the through holes, thereby supporting the rear surface of the wafer W and moving up and down the wafer W. Through a conveyance port 15, the wafer W is transferred between an external conveyance arm 10 and the rotary table 2.

A reaction gas nozzle 31, a reaction gas nozzle 32, and separation gas nozzles 41 and 42, each of which contains, for example, quartz, are disposed above the rotary table 2. In the illustrated example, the separation gas nozzle 41, the reaction gas nozzle 31, the separation gas nozzle 42, and the reaction gas nozzle 32 are arranged in this order in the clockwise direction from the conveyance port 15 (in the rotation direction of the rotary table 2), at intervals along the circumferential direction of the chamber 1. Respective base ends of these nozzles 41, 31, 42, and 32, that is, gas introduction ports 41a, 31a, 42a, and 32a, are fixed to the outer peripheral wall of the container body 12. Accordingly, the nozzles 41, 31, 42, and 32 are introduced from the outer peripheral wall of the chamber 1 into the chamber 1, and are attached to extend in parallel with the rotary table 2 along the radial direction of the container body 12.

A first reaction gas supply source that stores a first reaction gas is connected to the reaction gas nozzle 31 via an opening/closing valve or a flow rate regulator (both are not illustrated). A second reaction gas supply source that stores a second reaction gas reactive to the first reaction gas is connected to the reaction gas nozzle 32 via an opening/closing valve or a flow rate regulator (both are not illustrated).

Here, the first reaction gas may contain a semiconductor element or a metal element, and may be used as an oxide film or a nitride film when becoming an oxide or a nitride. The second reaction gas may be an oxidation gas or a nitriding gas that may react with the semiconductor element or the metal element to produce a semiconductor oxide or a semiconductor nitride, or a metal oxide or a metal nitride. Specifically, the first reaction gas may be an organic semiconductor gas or an organic metal gas which contains a semiconductor element or a metal element. Further, the first reaction gas may be a gas having adsorptivity onto the surface of the wafer W. The second reaction gas may be an oxidation gas or a nitriding gas capable of undergoing an oxidation reaction or a nitriding reaction with the first reaction gas adsorbed onto the surface of the wafer W, and depositing a reaction compound on the surface of the wafer W.

Specifically, for example, the first reaction gas is a reaction gas containing silicon, and examples thereof include organic aminosilane such as diisopropylaminosilane or bis (tertiary-butylamino)silane (BTBAS), which forms $SiO_2$ as an oxide film or forms SiN as a nitride film. Alternatively, the first reaction gas is a reaction gas containing hafnium, and is tetrakisdimethylaminohafnium (hereinafter, referred to as "TDMAH") which forms HfO as an oxide film. Alternatively, the first reaction gas is a reaction gas containing titanium, and examples thereof include $TiCl_4$ that forms TiN as a nitride film. The second reaction gas is an oxidation gas such as, for example, ozone gas ($O_3$), or oxygen gas ($O_2$). Alternatively, the second reaction gas is a nitriding gas such as, for example, an ammonia gas ($NH_3$).

Further, the separation gas nozzles 41 and 42 is connected with a supply source of a noble gas such as Ar or He or an inert gas such as nitrogen ($N_2$) gas via an opening/closing valve or a flow rate regulator (both are not illustrated). The inert gas supplied from the separation gas nozzles 41 and 42 is also called a separation gas. In the embodiment, for example, $N_2$ gas is used as the inert gas.

In addition to the first reaction gas supply source, the second reaction gas supply source, and the supply source of the noble gas such as Ar or He or the inert gas that is also used as the separation gas such as nitrogen ($N_2$) gas, are connected to the reaction gas nozzle 31. These supply sources are provided such that the gases to be supplied are switchable through the operation of a switching unit (not illustrated). In addition to the second reaction gas supply source, the first reaction gas supply source, and the supply source of the inert gas that is also used as the separation gas are connected to the reaction gas nozzle 32. These supply sources are provided such that the gases to be supplied are switchable through the operation of a switching unit (not illustrated).

The region defined below the reaction gas nozzle 31 becomes a first processing region P1 for allowing the first reaction gas to be adsorbed on the wafer W. The region defined below the reaction gas nozzle 32 becomes a second processing region P2 for oxidizing or nitriding the first reaction gas adsorbed on the wafer W in the first processing region P1.

Within the chamber 1, two convex portions 4 are attached to the back surface of the top plate 11 so as to protrude toward the rotary table 2. The convex portions 4 and the separation gas nozzles 41 and 42 form separation regions D. That is, the regions below the separation gas nozzles 41 and 42 become the separation regions D that separate the first processing region P1 from the second processing region P2 and prevent mixing of the first reaction gas and the second reaction gas. The convex portion 4 has a substantially fan-shaped planar shape whose apex is cut in an arc shape. In the present disclosure, the inner arc is connected to a protrusion 5 (see FIG. 1) protruding from the ceiling surface 45, and the outer arc is arranged along the inner peripheral surface of the container body 12 of the chamber 1. As illustrated in FIG. 1, the protrusion 5 is provided so as to surround the outer periphery of the core 21 fixing the rotary table 2.

The convex portions 4 illustrated in FIG. 2 are attached to the back surface of the top plate 11. Therefore, the lower surfaces of the convex portions 4 are lower than the ceiling surface 45 located on both sides of the lower surface in the circumferential direction.

In each of the convex portions 4, a groove (not illustrated) is formed at the center in the circumferential direction, and each of the separation gas nozzles 41 and 42 is accommodated therein. Gas discharge holes are formed in the separation gas nozzles 41 and 42.

The reaction gas nozzles 31 and 32 are provided in the vicinity of the wafer W apart from the ceiling surface 45. $N_2$ gas supplied from the separation gas nozzle 42 acts as a counter flow against the first reaction gas from the first processing region P1, and the second reaction gas (the oxidation gas or the nitriding gas) from the second processing region P2. Therefore, the first reaction gas from the first processing region P1 and the second reaction gas from the second processing region P2 are separated by the convex portion 4 and $N_2$ gas. Therefore, within the chamber 1, the first reaction gas and the second reaction gas are suppressed from being mixed and reacting with each other.

The first exhaust port 610 and a second exhaust port 620 are formed between the rotary table 2 and the inner peripheral surface of the container body 12. The pressure regulator (e.g., auto pressure controller (APC)) 650 is provided in the exhaust pipe 630 between the first exhaust port 610 and the vacuum pump 640 illustrated in FIG. 1. Similarly, the second exhaust port 620 is also connected to a vacuum pump via an exhaust pipe provided with a pressure regulator (all not illustrated). With this configuration, the exhaust pressures of the first exhaust port 610 and the second exhaust port 620 are independently controllable.

As illustrated in FIG. 1, a heater unit 7 as a heater is provided in a space between the rotary table 2 and the bottom 14 of the chamber 1. In the heater unit 7 provided below the rotary table 2, the wafer W on the rotary table 2 is heated to a temperature (for example, 450° C.) determined by a process recipe, through the rotary table 2.

The case 20 is provided with a purge gas supply pipe 72 for supplying $N_2$ gas as a purge gas and performing purging. Further, the bottom 14 of the chamber 1 is provided with a plurality of purge gas supply pipes 73 for purging of the arrangement space of the heater unit 7 at predetermined angle intervals in the circumferential direction below the heater unit 7. A ring-shaped cover member 71 is provided on the lower side near the peripheral edge of the rotary table 2, and a lid member 7a is provided between the heater unit 7 and the rotary table 2 to cover the heater unit 7. The lid member 7a may be made of, for example, quartz. Accordingly, intrusion of gas into the region where the heater unit 7 is provided is suppressed.

By supplying $N_2$ gas from the purge gas supply pipe 72 and the purge gas supply pipes 73, the flow of the $N_2$ gas may suppress gases within a space 481 and a space 482 illustrated in FIG. 2 from being mixed via the space below the center of the chamber 1 and the space below the rotary table 2.

A separation gas supply pipe 51 is connected to the central portion of the top plate 11 of the chamber 1, and is configured to supply $N_2$ gas as a separation gas to a space 52 between the top plate 11 and the core 21. The separation gas supplied to the space 52 is discharged toward the peripheral edge along the surface of the rotary table 2 on the wafer placing region side, via a narrow space 50 between the protrusion 5 and the rotary table 2. The space 50 may be maintained at a higher pressure than the space 481 and the space 482, by the separation gas. Therefore, due to the space 50, the first reaction gas supplied to the first processing region P1 and the second reaction gas supplied to the second processing region P2 are suppressed from being mixed via the space 52.

The film forming apparatus is provided with a controller 100 that controls the operation of the film forming apparatus. Various sensors are provided in the film forming apparatus. As an example of various sensors, a temperature sensor 60 is provided to measure the temperature of the rotary table 2. The temperature sensor 60 may be, for example, a radiation thermometer that is provided above the rotary table 2, and determines deviation of the wafer W placed on the stage by using a difference in the material between the rotary table 2 and the wafer W, or measures the temperature of the rotary table 2. The temperature sensor 60 is disposed in contact with the rotary table 2 or in a non-contact manner to measure the temperature of the rotary table 2.

When the temperature sensor 60 is a radiation thermometer, for example, the radiation thermometer is provided on a window outside the chamber 1, and measures the intensity of infrared rays or visible light emitted from an object to measure the temperature of the object. By using the radiation thermometer for the temperature sensor 60, it is possible to measure the temperature of the rotary table 2 at high speed in a non-contact manner. The temperature sensor 60 transmits the measured temperature to the controller 100. The controller 100 acquires the temperature measured by the temperature sensor 60, and uses the temperature in controlling moving up and down of the rotary table 2.

Figure 3:
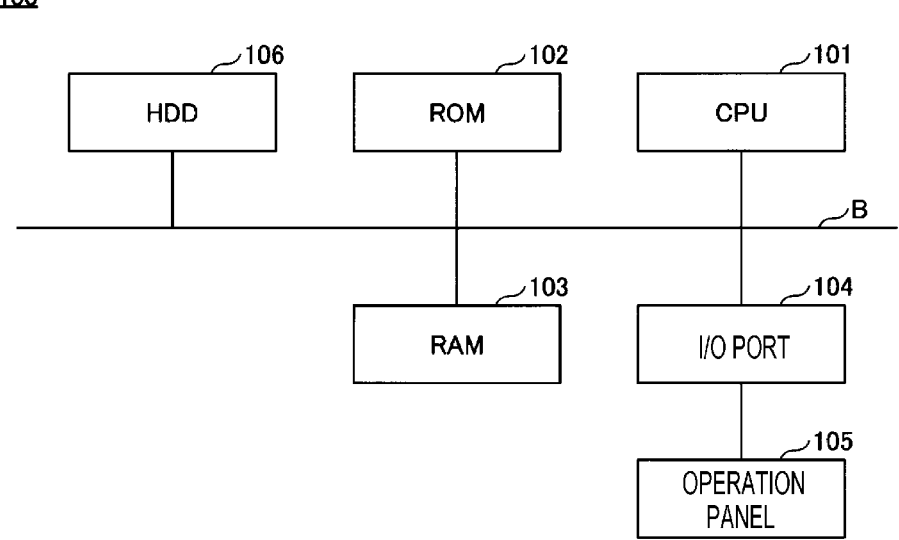
FIG. 3 is a view illustrating an example of a hardware configuration of a controller according to the embodiment.

Next, an example of a hardware configuration of the controller 100 according to the embodiment will be described with reference to FIG. 3. The controller 100 includes a central processing unit (CPU) 101, a read only memory (ROM) 102, a random access memory (RAM) 103, an I/O port 104, an operation panel 105, and a hard disk drive (HDD) 106. These parts are connected by a bus B.

The CPU 101 controls the operation of the controller 100 based on, for example, a program or a process recipe for performing film forming processing or cleaning processing, which is stored in a storage device such as the HDD 106. For example, the program includes a program that executes the control method of the rotary table. The CPU 101 controls the film forming processing of the wafer W placed on the rotary table 2 based on the process recipe. The CPU 101 controls the cleaning processing within the chamber 1 based on the cleaning recipe. During an idle time in which the film forming processing and the cleaning processing are not performed, the CPU 101 controls moving up and down of the rotary table 2 based on the program that executes the control method of the rotary table.

The ROM 102 is a storage medium that is constituted by, for example, an electrically erasable programmable ROM (EEPROM), a flash memory, or a hard disk, and stores, for example, the program or the recipe of the CPU 101. The RAM 103 functions as, for example, a work area of the CPU 101.

The I/O port 104 acquires values of various sensors detecting the temperature, the pressure, the gas flow rate, etc., from the various sensors attached to the film forming apparatus, and transmits the values to the CPU 101. The I/O port 104 outputs a control signal output by the CPU 101 to each part of the film forming apparatus (the rotary table 2, the vacuum pump 640, etc.). The operation panel 105 through which an operator operates the film forming apparatus is connected to the I/O port 104.

The HDD 106 is an auxiliary storage device, and may store, for example, a process recipe as information that defines procedures for the film forming processing or the cleaning processing, or a program for executing the control method of the rotary table for an idle time.

[Control of Rotary Table]

In the film forming apparatus according to the present disclosure, a wafer W is loaded in a state where the rotary table 2 is stopped at the low position. In loading of the wafer W, first, a gate valve (not illustrated) is opened, and the wafer W is transferred into the recess 24 of the rotary table 2 by the conveyance arm 10 via the conveyance port 15 (see FIG. 2). This transfer is performed by moving up and down lift pins (not illustrated) from the bottom side of the chamber 1 via through holes of the bottom surface of the recess 24, in a state where the recess 24 is stopped at a position facing the conveyance port 15. Such transfer of the wafer W is performed by intermittently rotating the rotary table 2, and then the wafer W is placed in each of the five recesses 24 of the rotary table 2.

Here, when the inside of the chamber 1 is kept at a high temperature of 400° C. or higher and the wafer processing is performed, even if the heater unit 7 is stopped in order to unload and load the wafer W, the inside of the chamber 1 is still kept at a high temperature. Accordingly, when the wafer W is loaded into the chamber 1 and placed on the rotary table 2, the wafer W may be largely warped. Here, when the wafer W is placed on the rotary table 2, the rotary table 2 is moved down. Thus, even if the wafer W is warped, a space having an enough distance not to touch the ceiling surface is kept. When the wafer W is loaded and placed on the rotary table 2 in a state where the rotary table 2 is moved down, the wafer W may be suppressed from being damaged due to contact of the warped wafer W with the ceiling surface. Even if the wafer W placed on the rotary table 2 is still in a state of warpage, the rotary table 2 may be intermittently rotated and moved without waiting for settling of the warpage, so that the wafers W may be sequentially placed on the plurality of recesses 24, which results in improvement in productivity. That is, since there is a margin between the rotary table 2 and the ceiling surface, after one wafer W is placed on the recess 24 of the rotary table 2, prior to settling of the warpage of the placed wafer W, the next wafer W may be placed on the following recess 24. Accordingly, the total time when the plurality of wafers W is placed on the rotary table 2 may be shortened, which results in improvement in productivity.

Subsequently, the gate valve is closed, and the chamber 1 is exhausted to a minimum attainable vacuum degree by the vacuum pump 640. In a state where the rotary table 2 is moved down, $N_2$ gas that is a separation gas is discharged at a predetermined flow rate from the separation gas nozzles 41 and 42. $N_2$ gas is also discharged at a predetermined flow rate from the separation gas supply pipe 51 and the purge gas supply pipes 72 and 73 (see FIG. 1). $N_2$ gas is also discharged at a predetermined flow rate from the reaction gas nozzles 31 and 32. That is, $N_2$ gas is discharged from all the nozzles 31, 32, 41, and 42. Accordingly, the atmosphere within the chamber 1 becomes $N_2$ atmosphere. With this, the inside of the chamber 1 is adjusted to a preset pressure by the pressure regulator 650.

In the embodiment, purging of $N_2$ gas is performed not only from the separation gas nozzles 41 and 42 but also from the reaction gas nozzles 31 and 32. However, a noble gas such as, for example, Ar gas or He gas may be supplied from the reaction gas nozzles 31 and 32. This point is also the same for the separation gas nozzles 41 and 42, and a desired inert gas may be selected according to the application.

Next, while the rotary table 2 is rotated clockwise at a predetermined rotation speed, the wafer W is heated by the heater unit 7. In a state where the rotary table 2 is moved down, the wafer W placed on the recess 24 of the rotary table 2 are close to the heater unit 7 as compared to a state where the rotary table 2 is moved up. Thus, the temperature of the wafer W may be increased as compared to the state where the rotary table 2 is moved up.

The temperature of the wafer W in the film forming processing performed in the state where the rotary table 2 is moved up is set to a predetermined temperature in the range of 50° C. to 780° C., for example, about 400° C. When the heater unit 7 is set such that the temperature of the wafer W in the film forming processing performed in the state where the rotary table 2 is moved up becomes about 400° C., the temperature of the wafer W is increased in a state where the rotary table 2 is moved down, and becomes, for example, a preset target temperature of about 410° C. to 420° C. Accordingly, a stand-by state is made and the film forming processing is ready to start. The rotation speed of the rotary table 2 may be variable in a range of, for example, 1 rpm to 240 rpm according to the application.

During the film forming processing, the controller 100 rotates the rotary table 2 by adjusting the rotation speed to the above speed in a state where the rotary table 2 is moved up to the highest position. After the film forming processing is ended, the controller 100 moves down the rotary table 2 while rotating the rotary table 2. After the rotary table 2 is moved down to the lowest position, the controller 100 stops the rotation and unloads the processed wafer W.

The above described series of operations including loading of wafers W→film forming processing→unloading of the wafers W is also called "lot processing." When a reservation for the next lot processing is accepted, the controller 100 continuously loads wafers of the next lot, and continuously executes the film forming processing. In this manner, continuously performing wafer processing for a plurality of lots is also called "continuous processing." In the case of continuous processing, immediately after wafers W of the previous lot are unloaded, wafers W of the next lot are loaded, and then the film forming processing is performed. Therefore, during the continuous processing for the plurality of lots, the inside of the chamber 1 is kept at a high temperature, and the temperature of the rotary table 2 is stabilized.

However, during an idle time during which, for example, the film forming processing is not performed within the chamber 1, the temperature of the rotary table 2 is changed. As a result, in the subsequent lot processing, until the temperature of the rotary table 2 is stabilized to a temperature suitable for wafer processing, it becomes necessary to perform treatment processing. Then, the productivity is lowered.

Therefore, in the control method of the rotary table 2 of the present disclosure, the controller 100 controls the moving up and down of the rotary table 2 during the idle time in the film forming apparatus. Accordingly, it is possible to efficiently suppress the temperature fluctuation of the rotary table 2. According to this control method, a dummy wafer may be useless unlike in the method in which the dummy wafer is loaded instead of the wafer W during the idle time and dummy wafer processing is performed so as to suppress a temperature change of the rotary table 2.

The control method of the rotary table 2 of the present disclosure is executed during the idle time. In the present specification, the time during which a specific process is not performed in the film forming apparatus is called "idle time." The specific process includes lot processing of the wafers W, continuous processing of continuously performing the lot processing, and a maintenance process including treatment processing and cleaning processing within the chamber 1. The lot processing may include film forming processing, etching processing, and annealing processing. When the specific process is not performed in the chamber 1, the controller 100 determines that the idle time is reached, and controls the moving up and down of the rotary table 2 based on the temperature measured by the temperature sensor 60.

[Control Method of Rotary Table]

Hereinafter, the control method of the rotary table 2 of the present disclosure will be described with reference to FIG.

Figure 4:
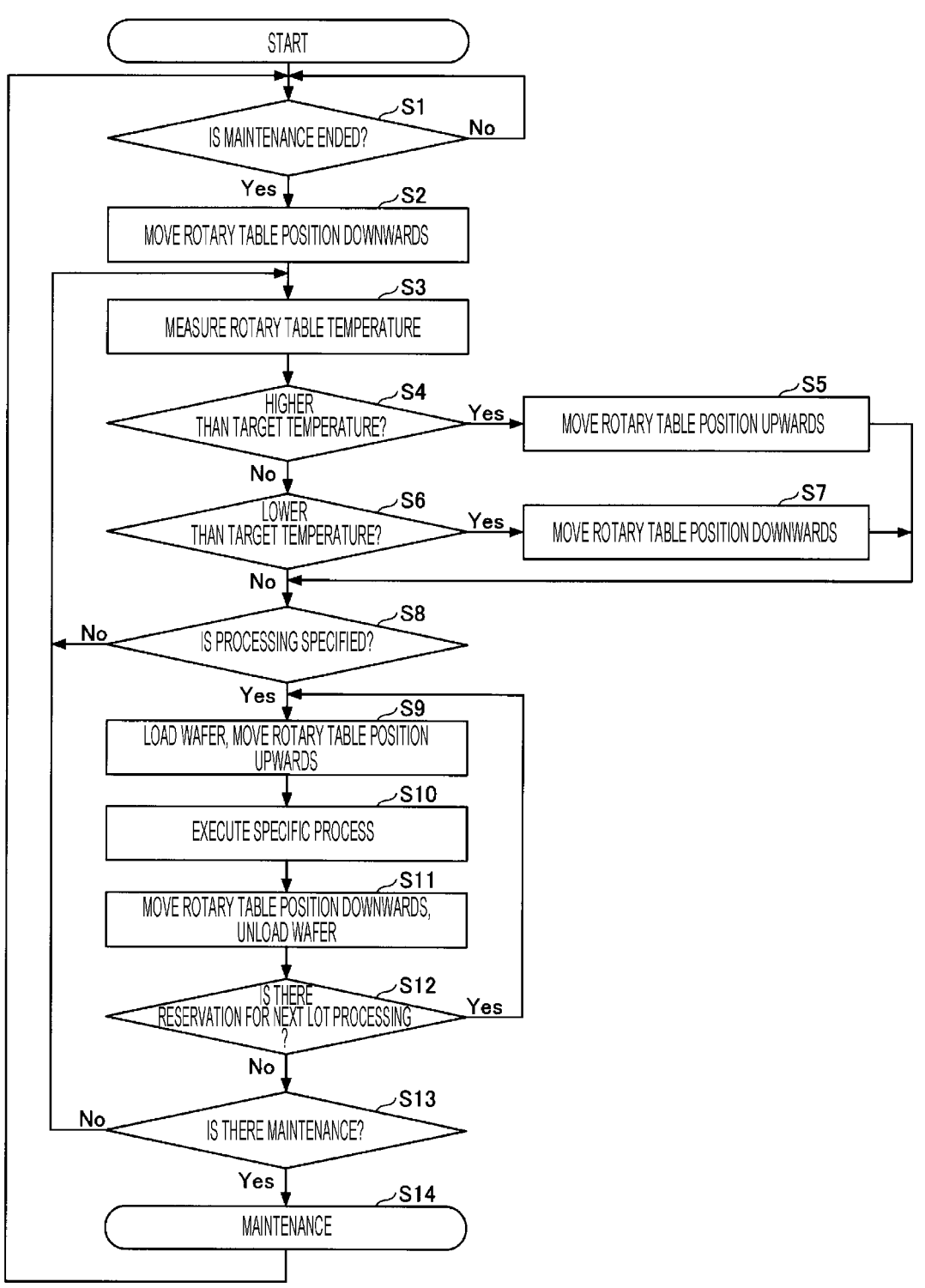
FIG. 4 is a flowchart illustrating an example of a rotary table control method according to the embodiment.

4 to FIGS. 6A to 6E. FIG. 4 is a flowchart illustrating an example of the control method of the rotary table 2 according to the embodiment. FIGS. 5A to 5E and FIGS. 6A to 6E are views for explaining the control method of the rotary table 2 in FIG. 4. This process is controlled by the controller 100.

Figures 5A, 5B, 5C, 5D, 5E:
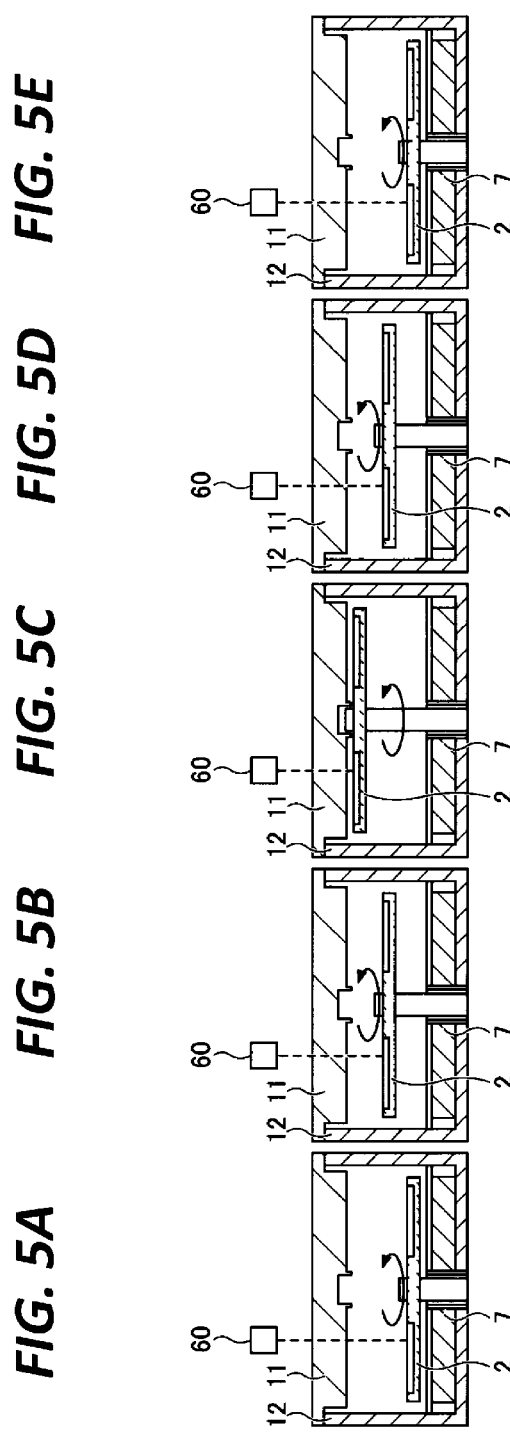
FIGS. 5A to 5E are views for explaining the rotary table control method according to the embodiment.

As an example, this process is started after a maintenance process is ended. Meanwhile, the present disclosure is not limited to this, and this process may be started when it is determined that an idle time is reached in the film forming apparatus. In step S1, the controller 100 determines whether the maintenance process of the film forming apparatus is ended, and waits until the maintenance process is ended. When it is determined that the maintenance process has ended, the controller 100 determines that the idle time during which the specific process is not performed is reached, and then proceeds to step S2, starts the rotation of the rotary table 2, and moves the rotary table 2 downwards. For example, as illustrated in FIG. 5A, the controller 100 may move down the rotary table 2 to the lowest position. Meanwhile, the processing in step S2 may be omitted.

Next, the process proceeds to step S3, and the temperature sensor 60 measures the temperature of the rotary table 2, and transmits the temperature to the controller 100. The controller 100 acquires the temperature of the rotary table 2 measured by the temperature sensor 60. Next, the process proceeds to step S4, and the controller 100 determines whether the acquired temperature of the rotary table 2 is higher than a target temperature. When it is determined that the acquired temperature of the rotary table 2 is higher than the target temperature, the controller 100 proceeds to step S5, and then moves the position of the rotary table 2 upwards while rotating the rotary table 2. Then, the process proceeds to step S8.

In step S4, when it is determined that the acquired temperature of the rotary table 2 is equal to or lower than the target temperature, the controller 100 proceeds to step S6, and determines whether the acquired temperature of the rotary table 2 is lower than the target temperature. When it is determined that the acquired temperature of the rotary table 2 is lower than the target temperature, the controller 100 proceeds to step S7, and then moves the position of the rotary table 2 downwards while rotating the rotary table 2. Then, the process proceeds to step S8.

In step S6, when it is determined that the acquired temperature of the rotary table 2 is equal to or higher than the target temperature, the controller 100 proceeds to step S8 straightly.

For example, when it is determined that the temperature of the rotary table 2 is higher than the target temperature in step S4, as illustrated in FIG. 5B, the controller 100 moves the position of the rotary table 2 upwards while rotating the rotary table 2. Accordingly, the position of the rotary table 2 becomes distant from the heater unit 7, and the temperature of the rotary table 2 may be decreased.

In step S8, the controller 100 determines whether the processing content has been specified. Determination as to whether the processing content has been specified is made depending on whether the recipe stored in the storage device such as the HDD 106 is specified. That is, the controller 100 determines whether the operator of the film forming apparatus has specified the processing content through an operation of the operation panel 105.

In step S8, when it is determined that the processing content is not specified, the controller 100 determines that the idle time is reached, and returns to step S3. Then, the controller 100 acquires the temperature measured by the temperature sensor 60 again, and repeats the loop processing of steps S4 to S7. Accordingly, based on the result of comparison between the acquired temperature and the target temperature, the position of the rotary table 2 is moved upwards or downwards.

For example, in step S4, when it is determined that the temperature of the rotary table 2 is higher than the target temperature, as illustrated in FIG. 5C, the controller 100 further moves the position of the rotary table 2 upwards. Accordingly, the position of the rotary table 2 further becomes distant from the heater unit 7, and the temperature of the rotary table 2 may be further decreased.

After the control of the state of FIG. 5C is performed, when it is determined that the temperature of the rotary table 2 is lower than the target temperature in step S6 of the loop processing of steps S4 to S7, the controller 100 moves the position of the rotary table 2 downwards while rotating the rotary table 2 as illustrated in FIG. 5D. Accordingly, the position of the rotary table 2 approaches the heater unit 7, and the temperature of the rotary table 2 may be increased.

A distance by which the rotary table 2 is moved up or down is determined such that the temperature of the rotary table 2 becomes the target temperature, based on the absolute value of a difference between the acquired temperature and the target temperature. Meanwhile, the controller 100 may calculate a relative value of a temperature change from the temperature measured by the temperature sensor 60 last time and the temperature measured this time, and based on the relative value, may determine a distance by which the rotary table 2 is moved up or down such that the temperature of the rotary table 2 becomes the target temperature.

In step S8, when it is determined that the processing content is specified, the controller 100 determines that the idle time is not reached, and moves the rotary table 2 to the lowest position. For example, as illustrated in FIG. 5E, the controller 100 moves the rotary table 2 to the lowest position while rotating the rotary table 2, and stops the rotation of the rotary table 2 at the low position as illustrated in FIG. 6A.

Figures 6A, 6B, 6C, 6D, 6E:
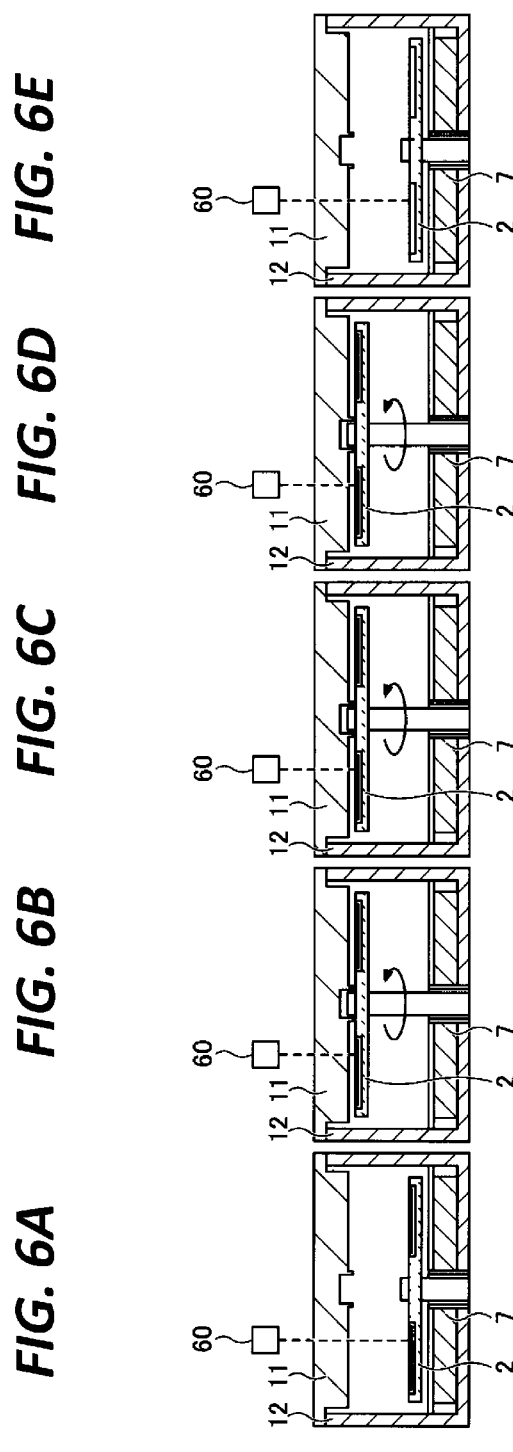
FIGS. 6A to 6E are views for explaining the rotary table control method according to the embodiment.

The process proceeds to step S9, and the controller 100 loads wafers W of one lot, and moves the position of the rotary table 2 upwards to the highest position as illustrated in FIG. 6B while rotating the rotary table 2. Next, the process proceeds to step S10, and the controller 100 executes processing specified by a process recipe. For example, while the rotary table 2 is rotated, the film forming processing is executed on the wafers W placed on the stages. When the film forming processing is ended, the process proceeds to step S11. Then, the controller 100 moves the position of the rotary table 2 downwards to the lowest position while rotating the rotary table 2, and then stops the rotary table 2, and unloads the wafers W.

Next, the process proceeds to step S12, and the controller 100 determines whether there is a reservation for the next lot processing. When it is determined that there is a reservation for the next lot processing, the controller 100 returns to step S9. Then, the controller 100 loads wafers W for the next lot, and moves the position of the rotary table 2 upwards to the highest position as illustrated in FIG. 6C while rotating the rotary table 2 again. Next, in step S10, the controller 100 executes the film forming processing for wafers of the next lot. After the film forming processing for the wafers of the next lot is ended, the processed wafers W are unloaded in step S11, and then, it is determined whether there are reservations for lot processing one after another in step S12. When it is determined that there are reservations for lot processing one after another, the controller 100 performs the processing of steps S9 to S11 again. As illustrated in FIG.

6D, the controller 100 performs the film forming processing while controlling the position of the rotary table 2 to the highest position. In this manner, by repeating the loop processing of steps S9 to S12 a plurality of times, continuous processing for a plurality of lots is performed. When the final lot processing in the continuous processing is ended, as illustrated in FIG. 6E, the rotary table 2 is moved down, and the wafers W are unloaded. The rotary table 2 is also moved down between FIG. 6B and FIG. 6C and between FIG. 6C and FIG. 6D so as to unload the wafers W and to load the wafers W of the next lot, but such an operation is omitted in the illustration.

In step S12, when it is determined that there is no reservation for the next lot processing, the controller 100 proceeds to step S13, and determines whether there is a maintenance process such as cleaning processing of the chamber 1.

In step S13, when it is determined that there is no maintenance process, the controller 100 determines that the idle time during which the specific process is not performed in the chamber 1 is reached, and returns to step S3. The controller 100 executes the processing of steps S3 to S7, and moves up and down the position of the rotary table 2 based on the temperature measured by the temperature sensor 60 until the next processing is specified in step S8. Accordingly, it is possible to suppress the temperature fluctuation of the rotary table 2 during the idle time.

In step S13, when it is determined that there is a maintenance process, the controller 100 proceeds to step S14, and executes the maintenance process of the film forming appa-ratus. During the maintenance process, the rotary table 2 is in a state where its rotation is stopped at the lowest position.

The process returns to step S1. Then, when it is deter-mined that the maintenance process has ended, the controller 100 determines that the idle time during which the specific process is not performed in the chamber 1 is reached, and then proceeds to step S2, starts the rotation of the rotary table 2, and moves the rotary table 2 downwards. Then, the controller 100 repeats the loop processing of steps S3 to S7 until the next processing is specified in step S8, and moves up and down the position of the rotary table 2 based on the temperature measured by the temperature sensor 60 so as to suppress the temperature fluctuation of the rotary table 2 during the idle time.

According to the above described rotary table control method of the embodiment, it is possible to efficiently suppress the temperature fluctuation of the rotary table 2 during the idle time of the film forming apparatus. Accord-ing to the rotary table control method of the present disclo-sure, by maintaining the stability of the temperature of the rotary table 2 during the idle time, it is possible to perform the specific process for the next lot in a state where the temperature is stabilized. This may increase the productivity. Then, a dummy wafer may be useless unlike in the method in which the dummy wafer is loaded instead of the wafer W and dummy wafer processing is performed so as to suppress a temperature change of the rotary table 2 during the idle time.

In the rotary table control method of the present disclo-sure, while the processing of steps S3 to S7 is performed during the idle time, the controller 100 may control the vacuum pump 640 so as to adjust the pressure within the chamber 1 to a pressure higher than the pressure within the chamber 1 during performing of the specific process. This increases the heat transfer efficiency between the heater unit 7 and the rotary table 2, and then, the temperature control of the rotary table 2 may be more efficiently performed.

Accordingly, it is possible to more efficiently suppress the temperature fluctuation of the rotary table during the idle time.

In the rotary table control method of the embodiment, in the processing of step S4, when the temperature acquired from the temperature sensor 60 is higher than the target temperature by a preset threshold value or more, the position of the rotary table 2 may be moved upwards. Similarly, in the processing of step S6, when the acquired temperature is lower than the target temperature by the preset threshold value or more, the position of the rotary table 2 may be moved downwards. According to this, when the measured temperature is close to the target temperature, and the temperature difference is less than the threshold value, the processing load may be reduced by not moving the rotary table 2 upwards or downwards.

According to one aspect, it is possible to efficiently suppress the temperature fluctuation of a rotary table during an idle time.

From the foregoing, it will be appreciated that various embodiments of the present disclosure have been described herein for purposes of illustration, and that various modifi-cations may be made without departing from the scope and spirit of the present disclosure. Accordingly, the various embodiments disclosed herein are not intended to be limit-ing, with the true scope and spirit being indicated by the following claims.

What is claimed is:

1. A method of controlling a processing apparatus, the method comprising:
   providing the processing apparatus including:
      a chamber in which a film-forming process is per-formed on a plurality of substrates;
      a rotary table accommodated within the chamber, includ-ing a stage on which the plurality of substrates is placed, and configured to be rotatable and movable in an up and down direction;
      a heater provided below the rotary table; and
      a temperature sensor configured to measure a tempera-ture of the rotary table;
   acquiring the temperature of the rotary table that is measured by the temperature sensor; and
   moving up and down a position of the rotary table according to a result of comparison between the acquired temperature and a target temperature during an idle time during which no substrate is loaded within the chamber,
   wherein in the moving up and down the position of the rotary table during the idle time, a pressure within the chamber is set to a pressure higher than a pressure within the chamber during performance of the film-forming process.

2. The method according to claim 1, wherein in the moving up and down of the position of the rotary table,
   when the acquired temperature is higher than the target temperature, the position of the rotary table is moved up, and
   when the acquired temperature is lower than the target temperature, the position of the rotary table is moved down.

3. The method according to claim 2, wherein in the moving up and down of the position of the rotary table,
   when the acquired temperature is higher than the target temperature by a preset threshold value or more, the position of the rotary table is moved up, and when the acquired temperature is lower than the target temperature by the preset threshold value or more, the position of the rotary table is moved down.

4. The method according to claim 3, wherein the idle time is reached when there is no lot processing, continuous processing, or maintenance process.

5. The method according to claim 4, further comprising:

performing a control such that a pressure within the chamber while the temperature of the rotary table is measured during the idle time becomes higher than a pressure within the chamber while performing lot processing.

6. The method according to claim 1, wherein the the method further comprises determining that the idle time is reached when there is no lot processing, continuous processing, or maintenance process.

7. The method according to claim 1, further comprising:

performing a control such that a pressure within the chamber while the temperature of the rotary table is measured during the idle time becomes higher than a pressure within the chamber while performing lot processing.

8. The method according to claim 1, wherein the idle time is the period other than a continuous processing of a lot processing in which the loading of the plurality of substrates, performing the film forming process on the plurality of substrates, and the unloading of the plurality of substrates are sequentially performed, and other than a maintenance process including a treatment process and a cleaning process within the chamber.

9. The method according to claim 8, wherein the lot processing includes an etching process and an annealing process.

10. A processing apparatus comprising:

a chamber in which a film-forming process on a plurality of substrates is performed;

a rotary table accommodated within the chamber, including a stage on which a plurality of substrates is placed, and configured to be rotatable and movable in an up and down direction;

a heater provided below the rotary table;

a temperature sensor configured to measure a temperature of the rotary table; and a controller, wherein the controller is configured to execute a process including:

acquiring the temperature of the rotary table that is measured by the temperature sensor, and moving up and down a position of the rotary table according to a result of comparison between the acquired temperature and a target temperature during an idle time during which no substrate is loaded within the chamber, wherein in the moving up and down the position of the rotary table during the idle time, a pressure within the chamber is set to a pressure higher than a pressure within the chamber during performance of the film-forming process.

* * * * *